(12) United States Patent
Ko

(10) Patent No.: US 9,207,273 B2
(45) Date of Patent: Dec. 8, 2015

(54) APPARATUS FOR INSPECTING TOUCH PANEL AND METHOD THEREOF

(71) Applicant: Samsung Display Co., Ltd., Yongin, Gyeonggi-do (KR)

(72) Inventor: Jun-Young Ko, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 198 days.

(21) Appl. No.: 13/961,104

(22) Filed: Aug. 7, 2013

(65) Prior Publication Data

US 2014/0197845 A1 Jul. 17, 2014

(30) Foreign Application Priority Data

Jan. 14, 2013 (KR) ........................ 10-2013-0003964

(51) Int. Cl.
*G01R 27/26* (2006.01)
*G01R 31/28* (2006.01)
*G06F 3/041* (2006.01)
*G06F 3/044* (2006.01)

(52) U.S. Cl.
CPC ............ *G01R 31/2829* (2013.01); *G06F 3/044* (2013.01); *G06F 3/0416* (2013.01)

(58) Field of Classification Search
CPC ................................ B32B 15/02; B32B 15/08
USPC .................................. 324/658, 665, 672, 679
See application file for complete search history.

(56) References Cited

U.S. PATENT DOCUMENTS 8,519,722 B1 * 8/2013 Prendergast ................... 324/658
2009/0262095 A1 10/2009 Kinoshita et al.
2011/0115738 A1 * 5/2011 Suzuki et al. ................. 345/173

FOREIGN PATENT DOCUMENTS

| JP | 2009-258935 | 11/2009 |
| JP | 2010-086026 | 4/2010 |
| KR | 10-2010-0101372 | 9/2010 |

* cited by examiner

*Primary Examiner* — Vincent Q Nguyen
(74) *Attorney, Agent, or Firm* — Knobbe Martens Olson & Bear LLP

(57) ABSTRACT

Disclosed herein is an apparatus for inspecting a touch panel and a method thereof, the apparatus includes a capacitance measuring unit measuring capacitance value of a number of regions set on a touch panel, and a defect determining unit determining whether or not a specific region is defective, by comparing the capacitance value of the specific region with the capacitance value of an adjacent region. According to the present embodiments, a touch panel having an improved defect detection ability and a method thereof, by comparing with capacitance of regions adjacent to each other, are provided.

18 Claims, 3 Drawing Sheets

|    | X0   | X1   | X2   | X3   |
|----|------|------|------|------|
| Y0 | 6954 | 6905 | 6789 | 6905 |
| Y1 | 7051 | 7104 | 7090 | 7095 |
| Y2 | 7191 | 7256 | 7164 | 7262 |
| Y3 | 5440 | 5565 | 5575 | 5664 |
| Y4 | 7102 | 7192 | 7120 | 7230 |

|    | X0   | X1   | X2   | X3   |
|----|------|------|------|------|
| Y0 | 6954 | 6905 | 6789 | 6905 |
| Y1 | 7051 | 7104 | 7090 | 7095 |
| Y2 | 7191 | 7256 | 7164 | 7262 |
| Y3 | 5440 | 5565 | 5575 | 5664 |
| Y4 | 7102 | 7192 | 7120 | 7230 |

R1      R2

APPARATUS FOR INSPECTING TOUCH PANEL AND METHOD THEREOF

CROSS-REFERENCE TO RELATED APPLICATIONS

This application claims priority to and the benefit of Korean Patent Application No. 10-2013-0003964, filed on Jan. 14, 2013, in the Korean Intellectual Property Office, the entire content of which is incorporated herein by reference.

BACKGROUND

1. Field

The present embodiments relate to an apparatus for inspecting a touch panel and a method thereof, and to an apparatus for inspecting a touch panel having more improved defect detection ability and a method thereof.

2. Description of the Related Technology

A touch screen panel is an input device capable of inputting a user's command by selecting instructions displayed on a screen, such as an image display device, with his/her hand or an object.

To this end, the touch panel is provided to the image display device to convert a contact position directly contacted by a person's hand or an object into electric signal. Therefore, the instruction contents selected at the contact position are recognized as input signal.

Since the touch panel as described above may be substituted for a separate input device such as a keyboard, a mouse which are connected to the display device and operated, it has gradually been widely used.

As a type of implementing the touch panel, a resistive type, an optical sensing type, a capacitive type, and the like, are known.

Among them, the capacitive type touch panel detects a change in the capacitance generated when a person's hand or an object contacts the panel, whereby a touch position may be recognized.

The capacitive type touch panel as described above is subjected to an inspecting process for detecting whether or not defect is occurred before shipping.

In the case of the inspecting process in the related art, capacitance in each region of the touch panel is measured and then is compared with the capacitance in each region and a reference value. When a region having capacitance lower than the reference value is existed, the touch panel is determined a defect panel.

However, in the case where a fine crack is generated in a wire, or the like, of the touch panel or only one wire is disconnected in double routing structure, the capacitance is decreased. Therefore, the inspecting process in the related art does not adequately detect the defect.

SUMMARY

An object to the present embodiments is to provide a touch panel having an improved defect detection ability and a method thereof, by comparing capacitance in adjacent regions to each other.

An apparatus for inspecting a touch panel includes: a capacitance measuring unit measuring capacitance value of a number of regions set on a touch panel; and a defect determining unit determining defect whether or not a specific region is defective by comparing with a capacitance value of the specific region and a capacitance value of adjacent region.

The defect determining unit may calculate difference in capacitance value between the specific region and the adjacent region, and then determine the specific region is defective when the difference in capacitance value is not smaller than a preset reference value.

The defect determining unit may divide a number of regions set on the touch panel into a plurality of groups and applies different reference value to each of groups.

The touch panel may include first sensor electrodes and second sensor electrodes intersected with each other.

The touch panel may be operated in a capacitive type manner.

A method of inspecting a touch panel includes: measuring capacitance value of a number of regions set on a touch panel; and comparing capacitance value in the specific region with the capacitance value in an adjacent region and determining whether or not the region is defective.

In a step of determining, the difference in capacitance value between the specific region and the adjacent region may be calculated, and then the specific region may be determined to be defective when the difference in capacitance value is not smaller than a preset reference value.

In a step of determining, the number of regions set on the touch panel may divide into a plurality of groups and a different reference value may be applied to each of the groups.

The touch panel may include first sensor electrodes and second sensor electrodes intersected with each other.

The touch panel may be operated in a capacitive type manner.

BRIEF DESCRIPTION OF THE DRAWINGS

The accompanying drawings, together with the specification, illustrate example embodiments, and, together with the description, serve to explain the principles of the present embodiments.

DETAILED DESCRIPTION

Figure 1:
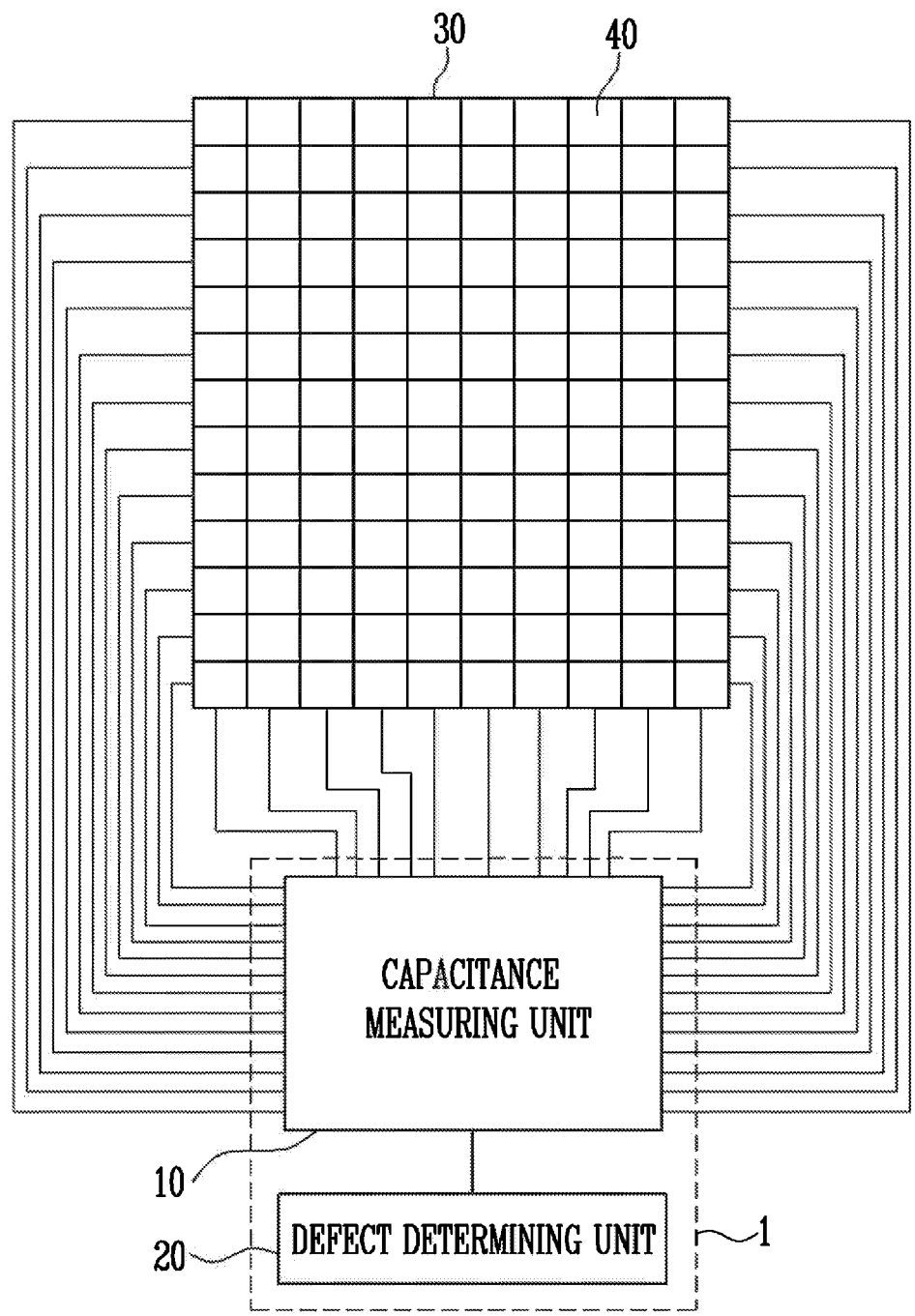
FIG. 1 is a view showing a touch panel according to an embodiment.

In the following detailed description, only certain example embodiments have been shown and described, simply by way of illustration. As those skilled in the art would realize, the described embodiments may be modified in various different ways, all without departing from the spirit or scope of the present embodiments. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals refer to like elements.

Specific matters of other example embodiments will be included in a detailed description and the accompanying drawings.

Advantages and features of the present embodiments and methods to achieve them will be elucidated from example embodiments described below in detail with reference to the accompanying drawings. However, the present embodiments are not limited to example embodiments disclosed below, but may be implemented in various different forms. In addition, in the following description, a case in which any part is connected to other part includes a case in which the parts are directly connected with each other and a case in which the parts are connected with each other, having another element interposed therebetween. In the accompanying drawings, portions unrelated to the description will be omitted in order to describe the present embodiments, and similar reference numerals will be used to describe similar portions throughout the present specification.

Hereinafter, an apparatus for inspecting a touch panel and a method thereof according to an example embodiment will be described with reference to the examples and the accompanying drawings.

FIG. 1 is a view showing an apparatus for inspecting a touch panel according to an embodiment.

The apparatus for inspecting the touch panel 1 according to the present embodiments is an apparatus for detecting whether or not a touch panel 30 is defective, the apparatus may be used for inspecting process before shipping the touch panel 30.

Referring to FIG. 1, the apparatus for inspecting the touch panel 1 according to the example embodiment includes a capacitance measuring unit 10 and a defect determining unit 20.

The capacitance measuring unit 10 may measure a capacitance in each region 40 of the touch panel 30.

The defect determining unit 20 may determine whether or not the specific region is defective, by comparing to the capacitance in the specific region and the capacitance of region adjacent to the specific region.

The defect determining unit 20 may determine a specific region to be defective when the difference in capacitance value between the capacitance of the specific region and the adjacent region is not smaller than a reference value.

Figure 2:
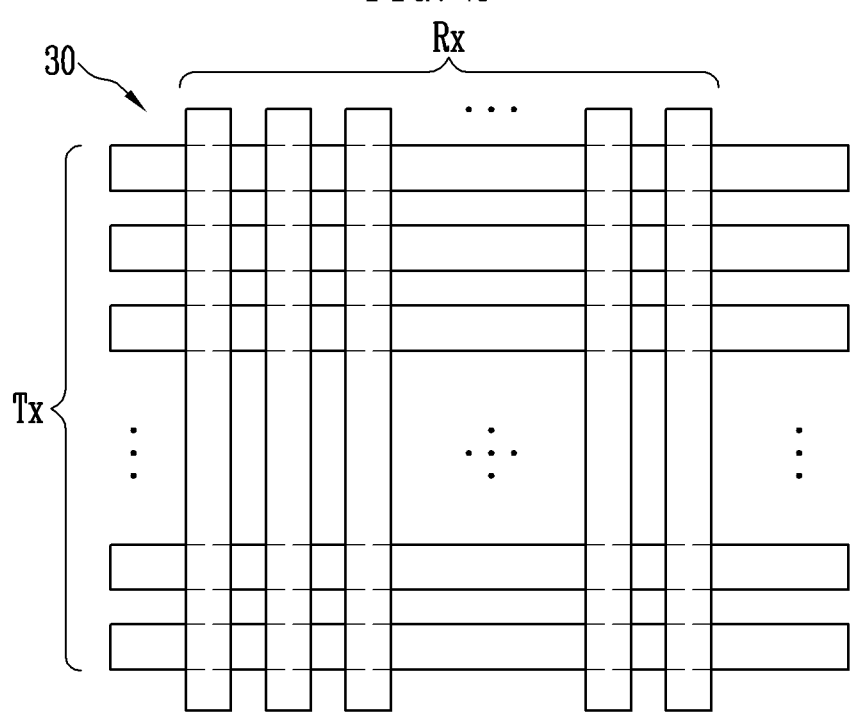
FIG. 2 is a view showing an embodiment of the touch screen panel shown in FIG. 1.

FIG. 2 is a view showing an embodiment of the touch screen panel shown in FIG. 1.

The touch panel 30 is a capacitive type touch sensor including a plurality of sensor electrodes for sensing a user's touch, and may include a plurality of touch-able regions 40 corresponding to the predetermined coordinates, respectively.

For example, the touch panel 30 may be configured to a mutual capacitance type or a self capacitance type.

Referring to FIG. 2, an example embodiment of the touch panel 30 will be described in more detail, the touch panel 30 may include first sensor electrodes Tx and second sensor electrodes Rx intersected with each other.

Here, each of the intersection parts between the first sensor electrodes Tx and the second sensor electrodes Rx may indicate the corresponding coordinates, and may become a plurality of regions 40 set to the touch panel 30, which is described above.

The first sensor electrodes Tx and the second sensor electrodes Rx may comprise a transparent conductive material, such as indium tin oxide (ITO), indium zinc oxide (IZO), carbon nano tube (CNT), graphene, etc.

Also, the first sensor electrodes Tx and the second sensor electrodes Rx are not limited to the examples as described above, and may comprise other conductive material.

Shapes of the first sensor electrodes Tx and the second sensor electrodes Rx are not limited to a bar shape shown in FIG. 2, the shapes thereof may be transformed into a diamond shape, or the like.

The first sensor electrodes Tx and the second sensor electrodes Rx may be positioned at different layers, respectively, and may also be positioned at a same layer through a bridge pattern, or the like.

Figures 3, 4, 5:
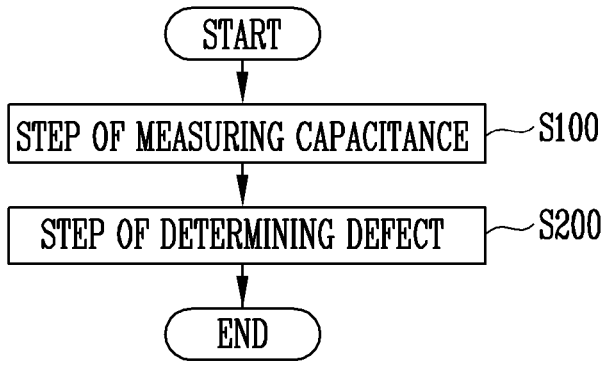
FIG. 3 is a view showing capacitance measured by each region of a touch panel according to an embodiment.
FIG. 4 is a view showing a case in which a region of a touch panel is divided into a plurality of groups, according to an embodiment.
FIG. 5 is a flow chart showing an inspecting method a touch panel according to an embodiment.

FIG. 3 is a view showing capacitance measured by each region of a touch panel according to an embodiment.

Here, for convenience of description, only the capacitance of a part of region is described in FIG. 3.

Referring to FIG. 3, operation of the apparatus for inspecting the touch panel 1 according to the example embodiment will be described.

As shown in FIG. 3, the capacitance measuring unit 10 may calculate the capacitance value of each region 40 of the touch panel 30.

Here, the capacitance measuring unit 10 may measure the capacitance value of each region 40 in the state in which the touch panel 30 is not touched.

Then, the defect determining unit 20 may determine whether or not a the specific region is defective, by comparing with the capacitance in the specific region and the capacitance in the region adjacent the specific region.

For example, as for a process of determining whether or not a region (X0, Y3) is defective, the defect determining unit 20 may respectively compare the capacitance value of the region (X0, Y3) with capacitance value of a region (X0, Y2), a region (X0, Y4), a region (X1, Y3), which are adjacent thereto.

In addition, the defect determining unit 20 may determine the specific region to be defective when the difference in capacitance value between the specific region and the adjacent region is not smaller than a reference value.

The capacitance value of the region (X0, Y3) is 5440, the capacitance value of the region (X0, Y2) is 7191. Therefore, the difference in the capacitance value between the regions is 1751.

Also, the capacitance value of the region (X0, Y3) is 5440, the capacitance value of the region (X0, Y4) is 7102. Therefore, the difference in the capacitance value between the regions is 1662.

Further, the capacitance value of the region (X0, Y3) is 5440, the capacitance value of the region (X1, Y3) is 5565. Therefore, difference in capacitance value between the regions is 125.

For example, when the reference value is set 1000, the region (X0, Y3) may be determined to be defective since the difference in capacitance value between the region (X0, Y3) and the region (X0, Y2) or the region (X0, Y4) is no smaller than the reference value.

When a plurality of regions adjacent the specific region which is an inspection object, and difference in capacitance value between the specific region and at least one region is no smaller than the reference value, the specific region is determined to be defective.

As another example for a process of determining whether or not the region (X0, Y3) is defective, the difference in capacitance value between a region (X2, Y3) and an adjacent region (X2, Y2) is 1589. Therefore the region (X2, Y3) may be determined to be defective.

Also, as for a process of determining whether or not a region (X1, Y1) region is defective, the difference in capacitance value between the region (X1, Y1) and an adjacent region (X1, Y0) may be 199, the difference in capacitance value between the region (X1, Y1) and an adjacent region (X2, Y1) may be 14, the difference in capacitance value between the region (X1, Y1) and an adjacent region (X1, Y2) may be 152, and difference in capacitance value between the region (X1, Y1) and an adjacent region (X0, Y1) may be 53.

For example, when the reference value is set 1000, the region (X1, Y1) may be determined to be normal since the entire difference in capacitance value between the region (X1, Y1) and the adjacent regions is not smaller than the reference value.

Here, the difference in the capacitance value between each of regions may be calculated as a ratio. In addition, the reference value is set to be a ratio.

For example, as for a process of determining whether or not a region (X0, Y3) is defective, difference in capacitance value between the region (X0, Y3) and an adjacent region (X0, Y2) may be about 32.19%, the difference in capacitance value between a region (X0, Y3) and an adjacent region (X0, Y4) may be about 30.55%, and the difference in capacitance value between the region (X0, Y3) and an adjacent region (X1, Y3) may be bout 2.30%, In this case, when the reference value is set to 20%, the region (X0, Y3) may be determined to be defective since the difference in capacitance value between the region (X0, Y3) and the region (X0, Y2) or the region (X0, Y4) is not smaller than the reference value FIG. 4 is a view showing the case in which a region of a touch panel is divided into a plurality of groups according to an embodiment.

The same reference value does not apply to determine whether or not a region is defective, there is a need to apply a different reference value according to a position of each of the regions 40 in the touch panel 30.

Accordingly, the defect determining unit 20 divides a number of regions 40 which are set on the touch panel 30 into a plurality of groups, and different reference values are applied to each group to determine whether or not the region is defective.

In FIG. 4, for example, a method in which a number of regions set on the touch panel 30 is divided into two groups (R1, R2) is described.

The first group R1 may include: a region (X0, Y0), a region (X0, Y1), a region (X0, Y2), a region (X0, Y3), a region (X0, Y4), a region (X1, Y0), a region (X1, Y1), a region (X1, Y2), a region (X1, Y3), a region (X1, Y4), a region (X2, Y0), a region (X2, Y1), a region (X3, Y0), and a region (X3, Y1). Also, the second group R2 may include: a region (X2, Y2), a region (X2, Y3), a region (X2, Y4), a region (X3, Y2), a region (X3, Y3), and a region (X3, Y4).

Here, the reference value of the first group R1 and that of the second group R2 are set to be a different value from each other.

For example, the reference value of the first group R1 is set to 1000, and that of the second group R2 is set to 2000.

As for a process of determining whether or not the region (X1, Y2) included in the first group R1 is defective, the difference in capacitance value between the region (X1, Y2) and the adjacent region (X1, Y3) is 1691.

Therefore, since the difference in capacitance value of both regions is not smaller than 1000, the region (X1, Y2) may be determined to be defective.

As for a process of determining whether or not the region (X2, Y3) included in the second group R2 is defective, difference in capacitance value between the region (X2, Y3) and the adjacent region (X1, Y3) region, the adjacent region (X2, Y2), the adjacent region (X2, Y4), or the adjacent region (X3, Y3) is smaller than 2000. Therefore, the (X2, Y3) region may be determined normal.

The difference in capacitance value of the region (X2, Y3) from the region (X2, Y2) or the region (X2, Y4) is larger than the reference value 1000 of the first group R1, but is smaller than the reference value 200 of the second group R2 such that the region (X2, Y3) may be determined to be normal.

FIG. 5 is a flow chart showing an inspecting method of a touch panel according to an embodiment.

Referring to FIG. 5, the inspecting method of the touch panel according to the embodiment includes a measuring capacitance S100 and a determining defect S200.

In the step of measuring capacitance S100, the capacitance value in a number of regions 40 set on the touch panel 30 is measured.

Then, in the step of determining defect S200, the specific region may be determined to be defective by comparing with the capacitance value of the specific region and the capacitance value of the adjacent region.

In the step of determining defect S200, the specific region may be determined to be defective when the difference in capacitance value between the specific region and the adjacent region is not smaller than a reference value.

In addition, in the step of determining defect S200, a number of regions 40 which are set on the touch panel 30 are divided into a plurality of groups, and a different reference value may be applied to each group.

Description of each of steps S100 and S200 is same as above described example embodiment, and will be omitted.

As set forth above, a touch panel having an improved defect detection ability and a method thereof are provided, by comparing capacitance in adjacent regions to each other.

While the present embodiments have been described in connection with certain example embodiments, it is to be understood that the embodiments are not limited to the disclosed embodiments, but, on the contrary, is intended to cover various modifications and equivalent arrangements included within the spirit and scope of the appended claims, and equivalents thereof.

What is claimed is:

1. An apparatus for inspecting a touch panel comprising,
    a capacitance measuring unit configured to measure a capacitance value of a plurality of regions of a touch panel; and
    a defect determining unit configured to determine whether or not a specific region is defective solely by comparing a capacitance value of the specific region with a capacitance value of an adjacent region.

2. The apparatus for inspecting a touch panel according to claim 1,
    wherein the defect determining unit calculates difference in capacitance values between the specific region and the adjacent region, and then determines that the specific region is defective when the difference in capacitance value is not smaller than a preset reference value.

3. The apparatus for inspecting a touch panel according to claim 2,
    wherein the defect determining unit divides a plurality of regions of the touch panel into a plurality of groups and applies different reference values to each of groups.

4. The apparatus for inspecting a touch panel according to claim 1,
    wherein the touch panel includes first sensor electrodes and second sensor electrodes intersected with each other.

5. The apparatus for inspecting a touch panel according to claim 4,
    wherein the touch panel is operated in a capacitive type manner.

6. The apparatus for inspecting a touch panel according to claim 4, wherein at least one of the first and second sensor electrodes comprise a transparent conductive material.

7. The apparatus for inspecting a touch panel according to claim 6, wherein the transparent conductive material is at least one of indium tin oxide (ITO), indium zinc oxide (IZO), carbon nano tube (CNT), and graphene.

8. The apparatus for inspecting a touch panel according to claim 4, wherein the first sensor electrodes and the second sensor electrodes are positioned on different layers.

9. The apparatus for inspecting a touch panel according to claim 4, wherein the first sensor electrodes and the second sensor electrodes are positioned on the same layer.

10. A method of inspecting a touch panel comprising,
    measuring a capacitance value of a plurality of regions of a touch panel; and
    comparing the capacitance value in the specific region solely with the capacitance value in an adjacent region and determining whether or not the region is defective.

11. The method of inspecting a touch panel according to claim 10,
    wherein in the step of determining,
    the difference in capacitance value between the specific region and the adjacent region is calculated, and then the specific region is determined to be defective when the difference in capacitance value is not smaller than a preset reference value.

12. The method of inspecting a touch panel according to claim 11,
    wherein in the step of determining,
    a plurality of regions of the touch panel is divided into a plurality of groups and different reference values are applied to each of the groups.

13. The method of inspecting a touch panel according to claim 10,
    wherein the touch panel includes first sensor electrodes and second sensor electrodes intersected with each other.

14. The method of inspecting a touch panel according to claim 13,
    wherein the touch panel is operated in a capacitive type manner.

15. The method of inspecting a touch panel according to claim 13, wherein at least one of the first and second sensor electrodes comprise a transparent conductive material.

16. The method of inspecting a touch panel according to claim 15, wherein the transparent conductive material is at least one of indium tin oxide (ITO), indium zinc oxide (IZO), carbon nano tube (CNT), and graphene.

17. The method of inspecting a touch panel according to claim 13, wherein the first sensor electrodes and the second sensor electrodes are positioned on different layers.

18. The method of inspecting a touch panel according to claim 13, wherein the first sensor electrodes and the second sensor electrodes are positioned on the same layer.

* * * * *